(12) United States Patent
Buenning et al.

(10) Patent No.: US 8,895,363 B2
(45) Date of Patent: Nov. 25, 2014

(54) DIE PREPARATION FOR WAFER-LEVEL CHIP SCALE PACKAGE (WLCSP)

(71) Applicant: NXP B.V., Eindhoven (NL)

(72) Inventors: Hartmut Buenning, Norderstedt (DE); Sascha Moeller, Hamburg (DE); Guido Albermann, Hamburg (DE); Thomas Rohleder, Hamburg (DE); Michael Zernack, Pinneberg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/833,906

(22) Filed: Mar. 15, 2013

(65) Prior Publication Data

US 2014/0264768 A1    Sep. 18, 2014

(51) Int. Cl.
*H01L 21/44*    (2006.01)
*H01L 21/78*    (2006.01)
*H01L 23/544*   (2006.01)

(52) U.S. Cl.
CPC .............. *H01L 21/78* (2013.01); *H01L 23/544* (2013.01)
USPC ........... 438/113; 438/114; 438/106; 438/107; 438/108; 438/460

(58) Field of Classification Search
USPC .................. 438/106, 107, 108, 113, 114, 460
See application file for complete search history.

(56) References Cited

PUBLICATIONS

U.S. Appl. No. 13/687,110, filed Nov. 28, 2012, Moeller, et al.

*Primary Examiner* — Long Pham

(57) ABSTRACT

Consistent with an example embodiment, there is a method for assembling a wafer level chip scale processed (WLCSP) device from a wafer substrate, the method comprises grinding the back-side of the wafer substrate to a prescribed thickness. A plurality of trenches is sawed along a plurality of device die boundaries on a back-side surface of the wafer, the trenches having a bevel profile. The plurality of trenches is etched until the bevel profile of the plurality of trenches is rounded.

6 Claims, 4 Drawing Sheets

DIE PREPARATION FOR WAFER-LEVEL CHIP SCALE PACKAGE (WLCSP)

FIELD

The embodiments of the present invention relate to semiconductor device packaging and, more particularly, to modifying WLCSP device die that enhance the manufacturability and quality of products.

BACKGROUND

The electronics industry continues to rely upon advances in semiconductor technology to realize higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

The packaging of an IC device is increasingly playing a role in its ultimate performance. For example, in mobile devices (i.e., mobile phones, tablet computers, laptop computers, remote controls, etc), bare WLCSP die may be used in their assembly. WLCSP components save valuable space in the mobile device. After assembly, in some example processes, customers encapsulate these WLCSP devices by injection molding or casing. This manual post-processing of the WLCSP may result in the device damage.

To accommodate the lack of space in the mobile devices, the WLCSP wafer is ground on its backside to a prescribed thickness. The grind process induces stress into the substrate, which may weaken and embrittle it. Further, the back-side edges of the bare die have sharp edges which are susceptible to damage from contact with assembly tooling.

There is a need for a WLCSP assembly process which can address the challenges raised by the needs of mobile applications.

SUMMARY

The present disclosure has been found useful in the packaging of semi-conductor devices which find their way into portable electronic devices. In particular, WLCSP products which are furnished as unpackaged die to manufacturers of mobile devices, who in turn encapsulate these devices directly onto a printed circuit board (in an effort to conserve valuable space in the mobile device) may subject these unpackaged die to rough handling. The handling may result in cracking or other latent damage which may not show up until the mobile device reaches the end user. Rounding of the edge profile of back-side of the unpackaged device die reduces the device's susceptibility to handling damage during assembly by the end user.

In example embodiment, there is a method for assembling a wafer level chip scale processed (WLCSP) device from a wafer substrate the method comprises grinding the back-side of the wafer substrate to a prescribed thickness. A plurality of trenches is sawed along a plurality of device die boundaries on a back-side surface of the wafer, the trenches having a bevel profile. A protective film is applied to the front-side surface of the wafer substrate. The plurality of trenches is etched until the bevel profile of the plurality of trenches is rounded.

In another example embodiment, an integrated circuit wafer comprises a silicon substrate. There is a plurality of active device die having boundaries on a front-side of the silicon substrate. Trenches having a rounded profile are formed on a back-side of the silicon substrate; the trenches located along device boundaries of the plurality of active device die.

In another embodiment, an integrated circuit device is made according to the described method.

The above summaries of the present disclosure are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1A:
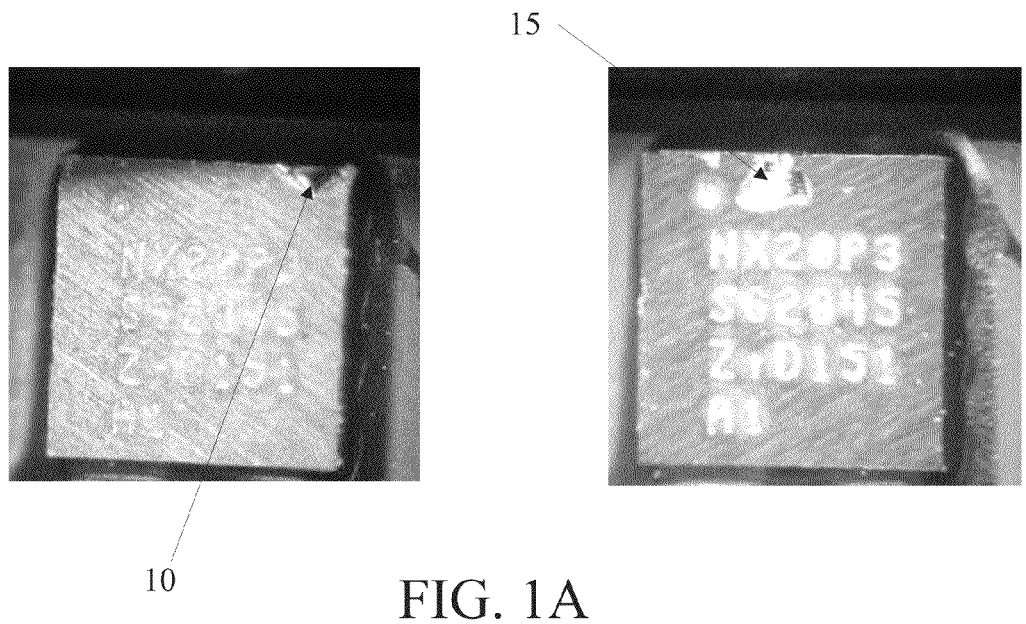
FIGS. 1A-1B are examples of damage to WLCSP device die that may occur during assembly.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Figure 1B:
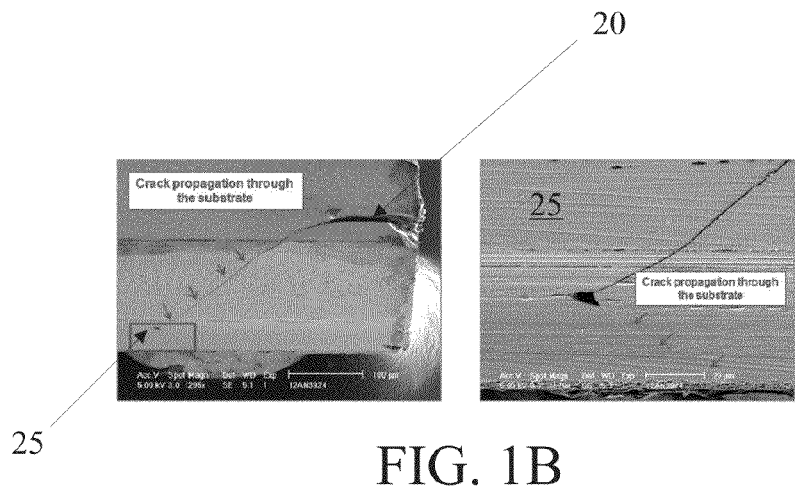

The disclosed embodiments have been found useful in preventing damage to the Wafer Level Chip-Scale Product (WLCSP) devices during their assembly. Such a process may be integrated into the customary back-end assembly. In an example assembly process, bare WLSCP device die, when separated out from the completed wafer substrate, have a very sharp edge profile which makes the device die susceptible to cracking during handling and assembly into the end user's system. Refer to FIGS. 1A and 1B. For example, chips 10 and 20 may occur during the system assembly device die 5 and 15. From a side-view, a crack 25 may propagate from the chips 10 and 15 to active device die regions (see enlarged view 30).

In an example embodiment, the user takes a wafer substrate having devices. The wafer undergoes electrical tests (e.g., E-sort) to sort out non-functioning devices; other processes may forego E-sort and cull out non-functioning devices after packaging. The tested wafers are mounted on an adhesive tape. A trench is cut into the wafer back-side (in areas corresponding to the scribe lanes) with a beveled dicing blade to obtain a kerf having a beveled side wall. Through an etching process, the edges of the kerf are rounded; the rounding of the edges relieves any stress and micro-damage due to the back grinding and beveled sawing. The die strength on the back-side of the device will increase and make the device less susceptible for mechanical impacts.

In one example process, a wet etch may be used. The silicon etchant, an example process may use, is a mixture of sulfuric acid, nitric acid, phosphorous acid, hydrofluoric acid and water. The specific ratios of acids and water used are determined by specific process requirements of etch rate, degree of anisotropy, the composition of the silicon substrate, degree of corner rounding, etc. During the etch process, the front side of the wafer is protected with a grinding tape. The wet etching may be a dip-etch or a spin etch. In another example process, a plasma etch may be used (e.g., $SF_6$). In another process, a vapor gas etch may be applied (e.g., $XeF_2$). Before an etching process, the front side of the wafer is covered with a protection layer; the protection layer may be a foil (e.g., a grinding foil, or a temporary acid-resistant coating).

The wafer is remounted on an FFC (Film Frame Carrier) also referred to as a "dicing frame." The wafer is sawed or diced with appropriate blades. The FFC tape is stretched to separate the device die.

To further reduce the likelihood of edge damage to the die, in another example process, a "stealth dicing" process may be used for separating such a wafer into individual ICs. Channels are formed in the one or more metallization layers on a front-side of the wafer along respective lanes along which the ICs are to be separated. These (separation) lanes are located between ICs and extend between a front-side of the wafer at the metallization layer(s), and a backside of the wafer at the silicon substrate. After forming the channels, the backside of the silicon substrate is thinned, and laser pulses are applied via the backside of the silicon substrate to change the crystalline structure of the silicon substrate along the lanes. This change in the silicon structure weakens the silicon in the lanes. The changed portions in the silicon substrate and the channels facilitate the propagation of cracks in the silicon substrate along the lanes during expansion of the wafer, while mitigating propagation of cracks outside of the lanes. With this approach, wafer separation can be achieved while mitigating issues that can arise from the formation of cracks.

More details of "stealth dicing" may be found in U.S. patent application (Ser. No. 13/687,110) of Sascha Moeller and Martin Lapke titled, "Wafer Separation" filed on Nov. 28, 2012 and is incorporated by reference in its entirety.

Figure 2:
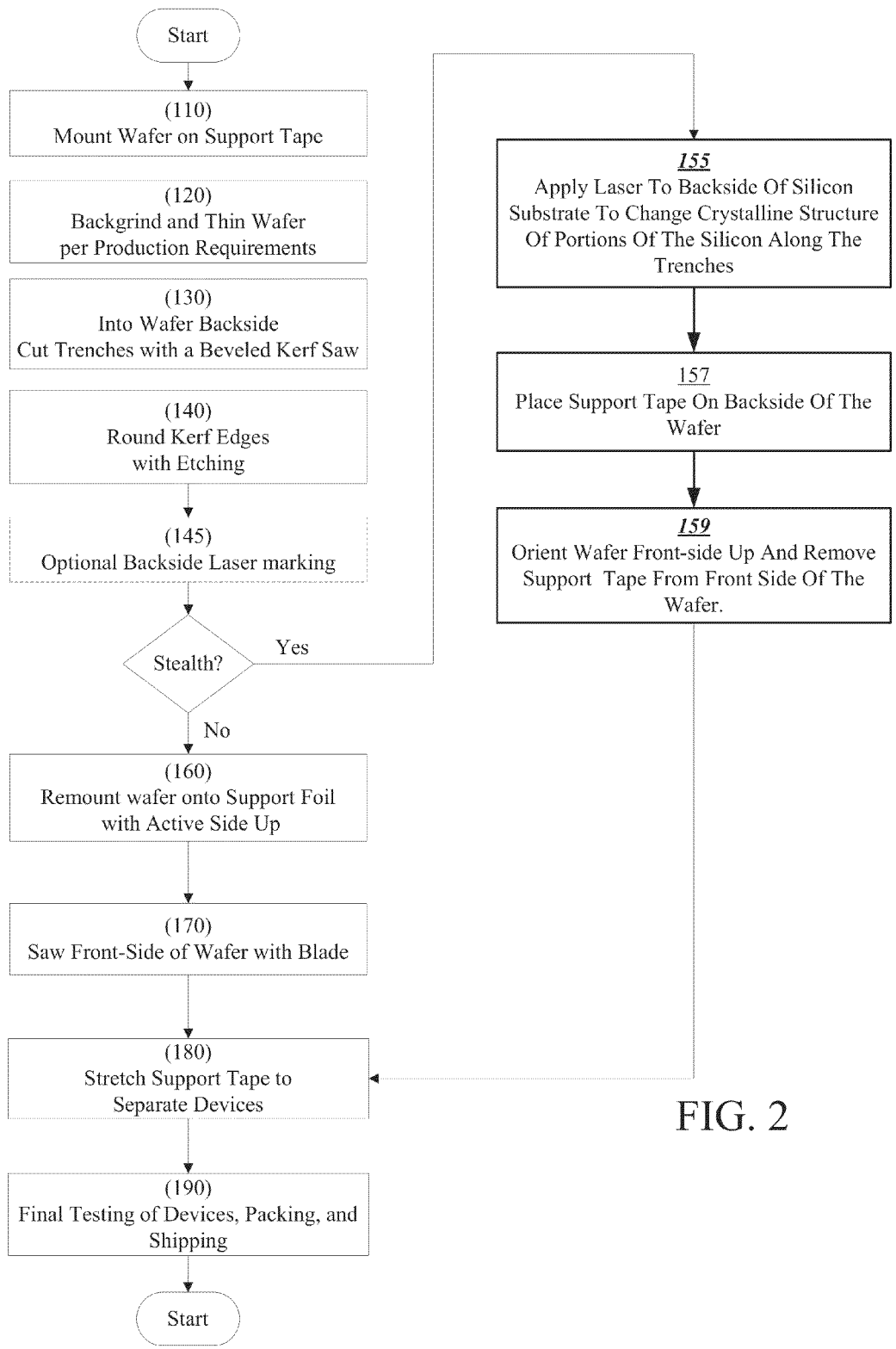
FIG. 2 is a flow diagram of an assembly process according to example embodiments.

Refer to FIG. 2. In an example embodiment according to the present disclosure, a wafer having undergone electrical testing is mounted on a sawing tape 110. As required for a given end user, the wafer back-side may undergo a back-grind to reduce the wafer thickness 120. Into the wafer back-side, trenches are cut between active device die with a blade having a beveled kerf 130.

For example, a pre-grinding thickness, of an eight-inch wafer (20.32 cm) is about 725 µm, for a six-inch wafer (15.24 cm) is about 675 µm. Note that this technique may be applied to wafer substrates of any size and may be useful for twelve-inch (30.48 cm) substrates. Further, devices using balls, bumps, pads, etc. benefit from the protective material. In an example process, a WLCSP is ground to a thickness of about 400 µm with a ball bond side of about 200 µm. It is desirable to achieve a minimum wafer thickness; however, it is limited by the technical ability to thin down wafers with 200 µm bumps. Thickness, in an example process may be in the range of about 150 µm to about 250 µm.

The positioning of the trenches may be determined by infrared, x-ray, etc. or other suitable imaging techniques. With an etching process, the kerf edges are rounded 140. In some end-user applications, the back-sides of the active device die may be laser-marked for product identification 145. With the device die (active side up), the wafer is remounted onto another flexible foil tape 160. The wafer is diced or sawed with a blade at the corresponding locations of the beveled trenches 170. The flexible foil tape is stretched so that devices may be separated 180. If required, a final testing of devices is done; the separated device die are packed and shipped to the end user 190.

In another example, embodiment, a "stealth" dicing process may be used. After the kerf edges are etched 140, a laser is applied to the backside of the silicon substrate so as to change the crystalline structure of portions of the silicon along the trenches 155. Support tape is placed on the backside of the wafer 157. The wafer is oriented front-side up and the support tape is removed from the front-side 159. As mentioned earlier, the front-side of the wafer is sawed 170, the support tape stretched 180, and the final testing, packing, and shipping of devices is completed 190.

Figures 3A, 3B:
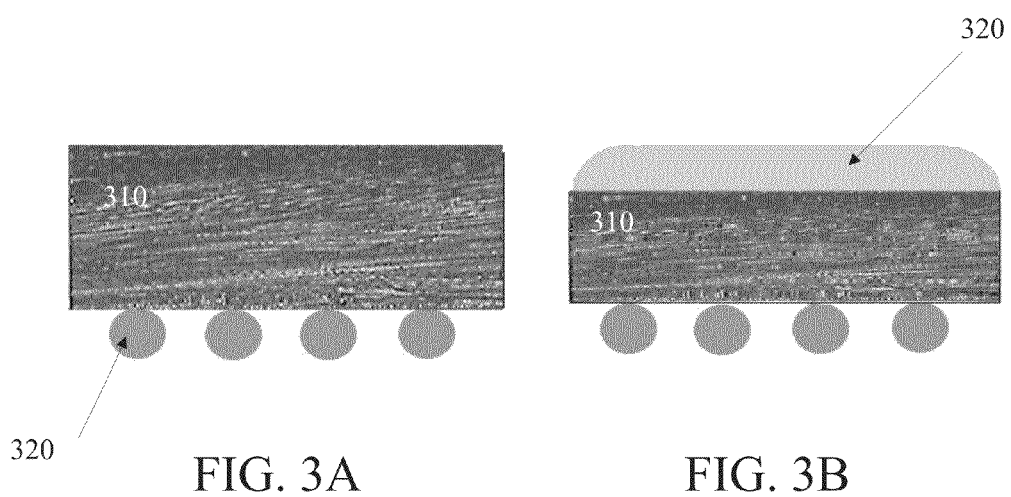
FIGS. 3A-3B illustrate a device die before and after the rounding of the edges of the back-side according to an example embodiment.
Figure 4A:
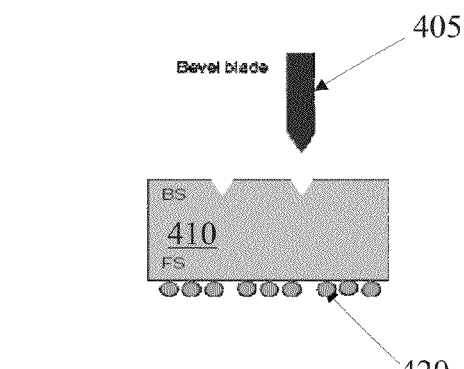
FIGS. 4A-4E show cross-sectional views, the preparation of a wafer substrate yielding device die with a rounded edge profile according to an example embodiment.
Figure 4B:
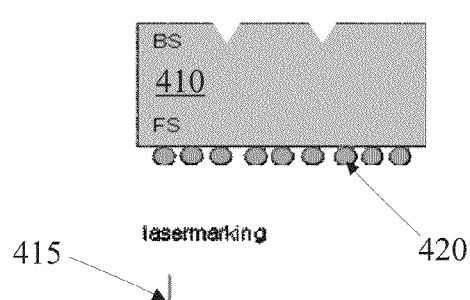
Figure 4C:
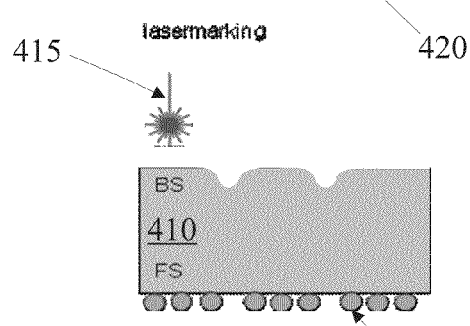
Figure 4D:
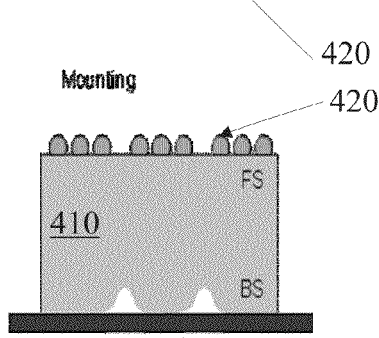
Figure 4E:
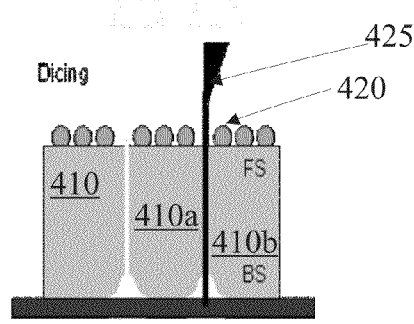

Refer to FIGS. 3A-3B. After undergoing the process outlined in FIG. 2, the WLSCP device die 310 with ball bonds 320 on the active side, has the sharp-edge profile of 3A transformed to the rounded profile 330 of FIG. 3B.

Refer to FIGS. 4A-4E. In an example embodiment according to the disclosure, it is instructive to view the process in cross-section. A wafer 410 having ball bonds 420 defining each device. A bevel blade 405 defines the trench having the desired kerf. These trenches 430 are cut between active devices in X and Y directions. With an etchant 425, the sharp bevel-edged trenches 430 are rounded. In some processes, to facilitate handling and manufacturing, an optional laser 425 may define product marking. The wafer 410 with the rounded trenches 435 is attached to an FFC material 440. From the ball bond 420 side, the wafer is sliced with a blade 445. Device die 410a, 410b, and 410c, for example are separated. The process may be applied to device die of a few square millimeters to those of in the square-centimeter range, that is, from tiny three-pin SCR type devices to very large scale systems on a chip.

Numerous other embodiments of the invention will be apparent to persons skilled in the art without departing from the spirit and scope of the invention as defined in the appended claims.

The invention claimed is:

1. A method for assembling a wafer level chip scale processed (WLCSP) device from a wafer substrate, the wafer substrate having a front-side surface with active device die and a back-side surface, the method comprising:
   grinding the back-side surface of the wafer substrate to a prescribed post-grind thickness;
   applying a protective film on front-side surface of the wafer substrate;
   sawing a plurality of trenches along a plurality of device die boundaries on the back-side surface of the wafer, the trenches having a bevel profile; and
   etching the plurality of trenches until the bevel profile of the plurality of trenches is rounded.

2. The method of claim 1, further comprising,
   mounting the wafer on the back-side surface onto a support film;
   slicing, at a depth of the prescribed thickness, through a front-side surface of the wafer substrate along the plurality of device boundaries through the plurality of rounded trenches; and
   separating the plurality of device die into separate die.

3. The method of claim 1 further comprising,
   slicing, at a depth of the prescribed thickness, through the back-side surface of the wafer substrate through the plurality of rounded trenches; and
   separating the plurality of device die into separate die.

4. The method of claim 1, wherein the etching is selected from the following: wet etching, plasma etching, vapor gas etching.

5. The method of claim 1, after the etching of the plurality of trenches, further comprising,
  laser marking device indicia in the vicinity of the plurality of device die boundaries on the back-side surface of the wafer.

6. The method of claim 1 further comprising, after the etching of the plurality of trenches,
  applying a laser to the back-side surface of the wafer to change a crystalline structure of portions of the wafer along the trenches;
  separating the device die along the trenches by expanding the wafer substrate while using the changed crystalline structure and the trenches, therein
  propagating cracks in the wafer substrate along the trenches, and
  mitigating cracking of the wafer substrate and device die boundaries outside the trenches.

* * * * *